United States Patent
Lim et al.

(10) Patent No.: US 6,927,163 B2
(45) Date of Patent: Aug. 9, 2005

(54) METHOD AND APPARATUS FOR MANUFACTURING A BARRIER LAYER OF SEMICONDUCTOR DEVICE

(75) Inventors: Bi O Lim, Seoul (KR); Han Choon Lee, Daejeon (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 10/180,754

(22) Filed: Jun. 26, 2002

(65) Prior Publication Data

US 2003/0003719 A1 Jan. 2, 2003

(51) Int. Cl.[7] .......................................... H01L 21/4763
(52) U.S. Cl. ...................................... 438/643; 438/659
(58) Field of Search .............................. 438/643, 659, 438/627, 629, 648, 653, 656, 658, 685

(56) References Cited

U.S. PATENT DOCUMENTS 5,801,097 A * 9/1998 Chang ........................ 438/643
6,146,993 A * 11/2000 Brown et al. ............... 438/627

* cited by examiner

*Primary Examiner*—Douglas Wille
*Assistant Examiner*—Ginette Peralta
(74) *Attorney, Agent, or Firm*—Timothy J. Keefer; Seyfarth Shaw LLP

(57) ABSTRACT

Disclosed is a method and an apparatus for manufacturing a barrier layer of semiconductor device. The disclosed comprises the steps of: forming an interlayer insulating layer having a contact hole on a semiconductor substrate; forming a Ti layer on the contact hole and on the interlayer insulating layer; and reacting the Ti layer with nitrogen radical to transform a part of the Ti layer into a TiN layer.

1 Claim, 4 Drawing Sheets

METHOD AND APPARATUS FOR MANUFACTURING A BARRIER LAYER OF SEMICONDUCTOR DEVICE

CROSS REFERENCE TO RELATED APPLICATION

This application claims the priority of Korean patent application Serial No. 2001-37810 filed on June 28, 2001.

BACKGROUND OF THE INVENTION

1. Field of the Invention

The present invention relates to a method for manufacturing a barrier layer of semiconductor device and, more particularly, to a method for manufacturing a barrier layer of semiconductor device to form a high purity TiN layer without performing Metal Organic Chemical Vapor deposition (MOCVD) process.

2. Description of the Prior Art

As is generally known, tungsten has been widely used to electrically connect upper and lower metal wire or metal wire and silicon substrate in semiconductor devices since tungsten has excellent thermal stability and step coverage. Before tungsten is deposited, Ti/TiN barrier layer is deposited ahead. The Ti layer of Ti/TiN barrier layer is used as a lower adhesive layer for the tungsten layer having poor adhesion with oxide layer and the TiN layer prevents reaction of the Ti layer and $WF_6$.

On the other hand, As the semiconductor device has been highly integrated, the size of contact hole becomes decreased and the depth becomes increased, thereby increasing the aspect ratio. Therefore, the Ti/TiN layer deposition by conventional sputtering method has reached the limitation. Considering this limitation, Collimator sputtering method and Low Through Sputtering (LTS) method have been proposed as a solution. However, these methods also have several defects.

Recently, a new method has been proposed that the Ti layer is deposited by Ionized Metal Plasma (IMP) and the TiN layer is deposited by Metal Organic Chemical Vapor Deposition (MOCVD).

FIGS. 1 to 4 are drawings showing a conventional method for manufacturing a barrier layer of semiconductor device. Referring to FIG. 1, first, an interlayer insulating layer 12, such as oxide layer, is deposited to have a sufficient thickness on a semiconductor substrate 10, such as silicon substrate having a predetermined contact region. Thereafter, the part of the interlayer insulating layer 12 on the contact region of the semiconductor substrate 10 is completely removed in accordance with a photolithography to expose the contact region, thereby forming a contact hole 13.

Then, a Ti layer 14 is deposited to have a thickness of 50~300 Å on the lower part and the side of contact hole 13 and on the surface of interlayer insulating layer 12 in accordance with IMP process.

Subsequently, a TiN layer 16 is deposited to have a thickness of 300~900 Å on the Ti layer 14 in accordance with MOCVD process, wherein the TiN layer 16 has a very low density. And, Tetrakis Dimethylamidotitanium (TDMAT) gas is generally used as a precursor.

After the deposition of the TiN layer 16, as shown in FIG. 2, the TiN layer 16 is subjected to nitrogen ($N_2$) plasma treatment, thereby transforming the TiN layer 16 having a low density into the TiN layer 26 having a high density, as shown in FIG. 3. Therefore, a barrier layer is completed, comprising the Ti layer 14 and the TiN layer 26.

After the barrier layer is formed, a tungsten layer is filled only in the contact hole in accordance with a conventional process. Then, a metal layer, such as aluminum layer, is formed on the barrier layer outside of the tungsten layer and the contact hole and a photolithography process is performed to complete a metal wiring pattern.

However, the conventional method has several problems that the TiN layer 26, formed by MOCVD process, has inferior properties and aging effect that properties are changed as time passes. And, the MOCVD device is very expensive and difficult to maintain. Moreover, the TDMAT gas is highly toxic and inflammable, thereby increasing possibility of accident and having a bad effect on the environment. And, as the TiN layer 26 is damaged by impurities such as residual gas, the properties of the TiN layer 26 are deteriorated. The TiN layer 26 may also be damaged during the plasma treatment.

Moreover, as shown in FIG. 3, it is difficult to perform plasma treatment on the sidewall of contact hole 13, thereby impurities, such as residual carbon (C), tend to remain on the TiN layer 26 located on the sidewall of contact hole 13.

SUMMARY OF THE INVENTION

Therefore, the present invention has been made to solve the above problems and the object of the present invention is to provide a method for manufacturing a barrier layer of semiconductor device capable of forming a high purity TiN layer without performing a MOCVD process.

Another object of the present invention is to provide a method for manufacturing a barrier layer of semiconductor device capable of preventing deterioration of TiN layer by impurities and plasma treatment.

Still another object of the present invention is to provide an apparatus for manufacturing a barrier layer applying the above-mentioned method.

In order to accomplish the above objects, the present invention comprises the steps of: forming an interlayer insulating layer having a contact hole on a semiconductor substrate; forming a Ti layer in the contact hole and on the interlayer insulating layer; and transforming an upper part of the Ti layer into a TiN layer by reacting the Ti layer with nitrogen radicals.

Preferably, the nitrogen radical is formed by performing high frequency microwave treatment to nitrogen gas. The frequency of microwave is in the range of 0.5 GHz to 4 GHz. The flow rate of nitrogen gas is in the range of 100 sccm to 10000 sccm. And, the TiN layer is formed at a temperature of normal to 500° C. and the pressure of 10 mTorr to 10 Torr.

The apparatus for manufacturing a barrier layer of semiconductor device according to the present invention includes: a reaction chamber; a heating unit arranged in the reaction chamber for supporting and heating a semiconductor substrate; a microwave generating unit for generating microwave; a nitrogen gas supplying unit for supplying nitrogen gas; a nitrogen radical generating unit for treating the nitrogen gas by the microwave to generate nitrogen radicals; and a nitrogen radical injecting unit arranged opposite to the heating unit in the reaction chamber with a predetermined distance for injecting the nitrogen radicals into the semiconductor substrate.

Preferable, the microwave generating unit generates microwave in the range of 0.5 GHz to 4 GHz. The nitrogen gas supplying unit supplies nitrogen gas in the range of 100 sccm to 10000 sccm. The reaction chamber is maintained at a temperature of normal to 500° C. and the pressure of 10 mTorr to 10 Torr. And, the nitrogen radical generating unit is arranged within 50 cm from the reaction chamber.

DETAILED DESCRIPTION OF THE INVENTION

The objects and features of the invention may be understood with reference to the following detailed description of an illustrative embodiment of the invention, taken together with the accompanying drawings.

Figure 5:
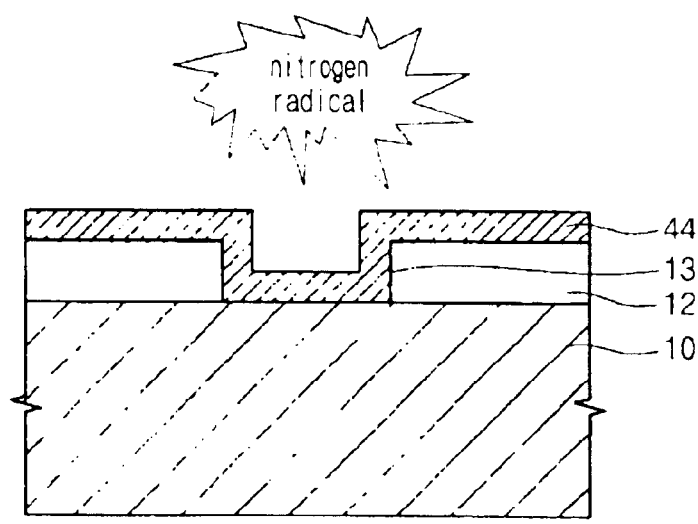
Figure 6:
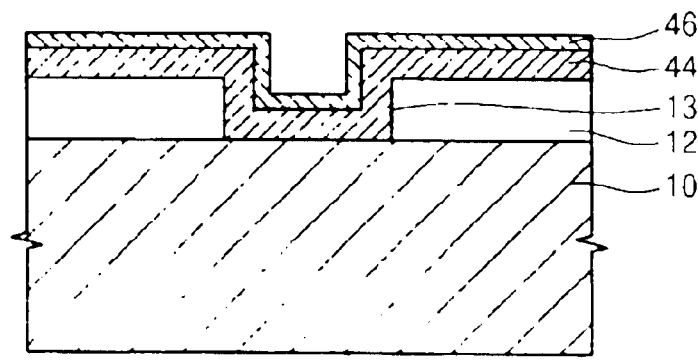
Figure 7:
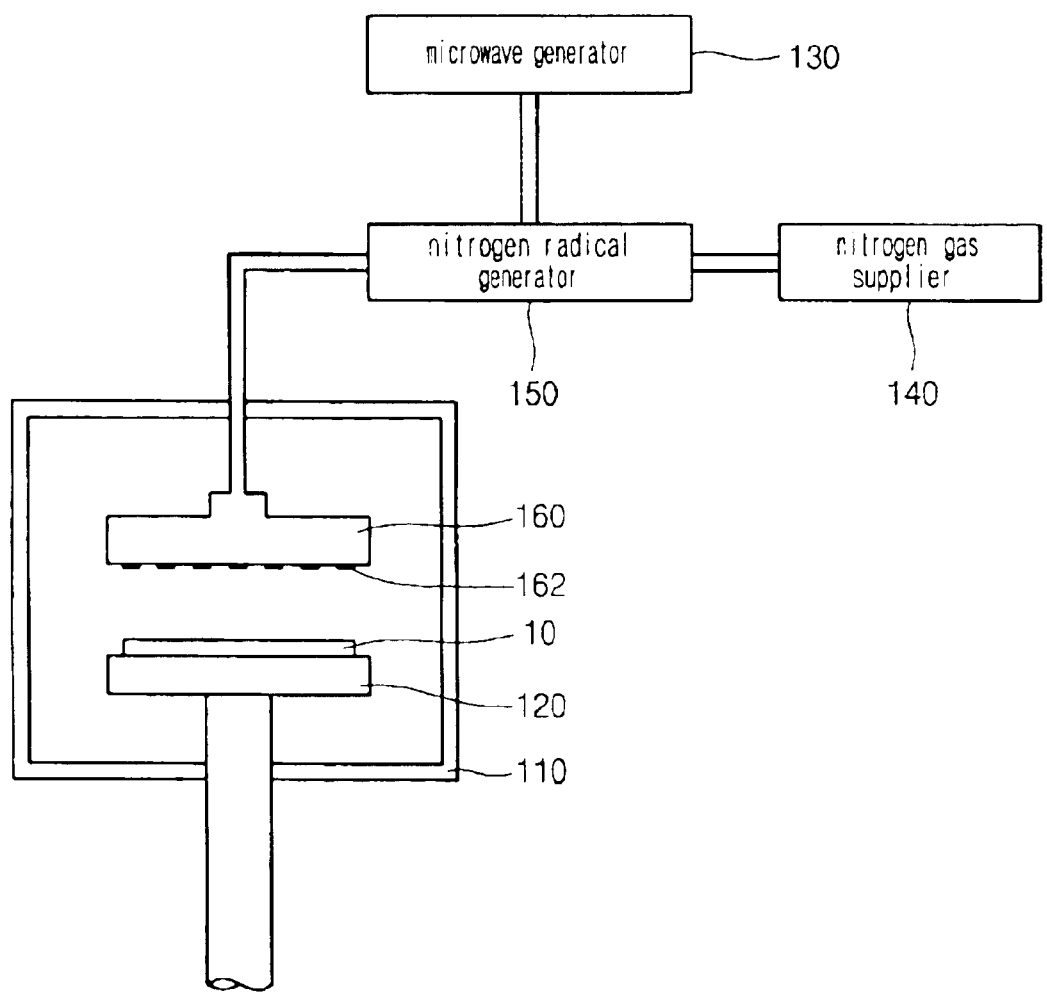
FIG. 7 is a drawing showing an outline of apparatus for manufacturing a barrier layer of semiconductor device according to the present invention.

FIGS. 4 to 7 are cross-sectional views showing a method for manufacturing a barrier layer of semiconductor device according to the present invention and FIG. 7 is a drawing showing an outline of apparatus for manufacturing a barrier layer of semiconductor device according to the present invention.

Referring to FIG. 7, a heating unit 120 is provided on the lower part of the reaction chamber 110 for supporting and heating a semiconductor substrate 10 to a predetermined temperature. A microwave generating unit 130 is arranged on the outside of reaction chamber 110 to generate high frequency microwave. A nitrogen gas supplying unit 140 supplies nitrogen gas to the reaction chamber 110 through a nitrogen radical generating unit 150 which is arranged on the outside of the reaction chamber 110 for treating the nitrogen gas by the microwave to generate nitrogen radical. A nitrogen injecting unit 160 is arranged opposite to the heating unit 120 on the upper part thereof in the reaction chamber 110 with a predetermined distance for injecting the nitrogen radical downward to the semiconductor substrate 10 through nozzle units 162.

The microwave generating unit 130 generates microwave in the range of 0.5 GHz to 4 GHz and the nitrogen gas supplying unit 140 supplies nitrogen gas in the range of 100 sccm to 10000 sccm. The reaction chamber is maintained at a temperature of normal to 500° C. and a pressure of 10 mTorr to 10 Torr.

The nitrogen radical generating unit 150 is arranged within 50 cm from the reaction chamber 110 to use most of nitrogen radicals for the formation of TiN layer without returning to the original state.

The method for manufacturing a barrier layer of semiconductor device by using the apparatus of FIG. 7 will be described in more detail with reference to drawings of FIGS. 4 to 7.

Figure 4:
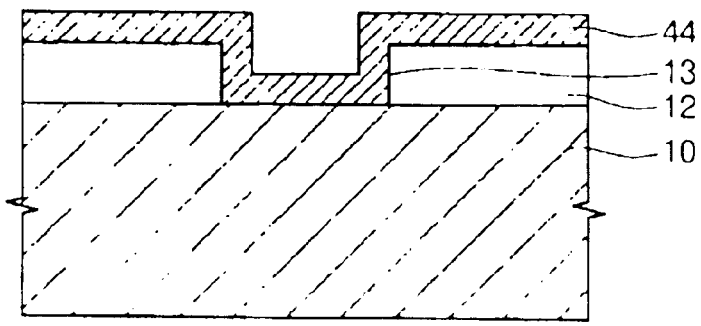
FIGS. 4 to 6 are cross-sectional views showing a method for manufacturing a barrier layer of semiconductor device according to the present invention.

Referring to FIG. 4, first, an interlayer insulating layer 12, such as oxide layer, is deposited to have a sufficient thickness on a semiconductor substrate 10 having a predetermined contact region. Although it is not shown in the drawing, diffusion regions such as source and drain regions of transistor are formed on the semiconductor substrate 10 with a lower structure such as a gate electrode and a bit line.

Thereafter, the interlayer insulating layer 12 on the contact region of the semiconductor substrate 10 is completely removed in accordance with a photolithography process to expose the contact region, thereby forming a contact hole 13.

Figure 1:
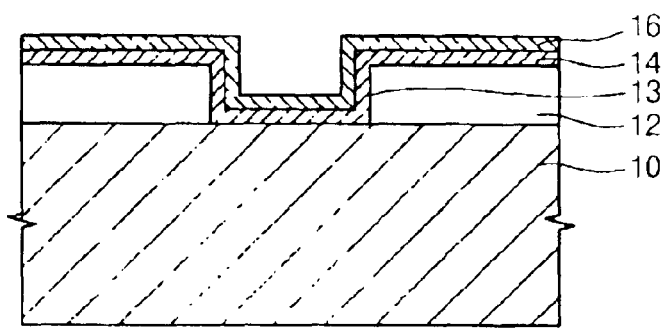
FIG. 1 is a cross-sectional view showing a barrier layer of semiconductor device according to a conventional art.
Figure 2:
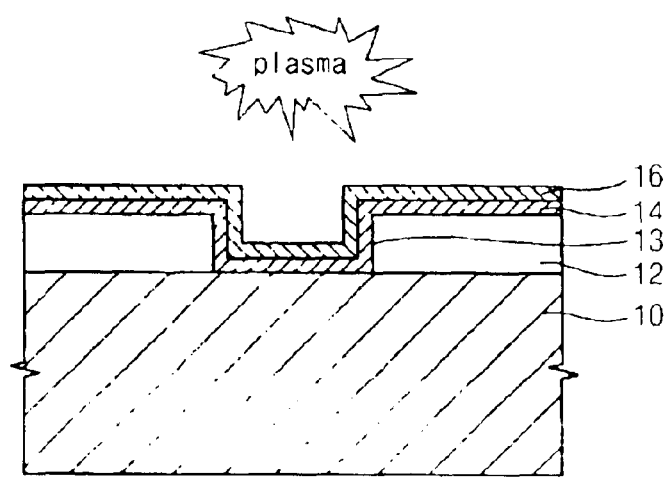
FIGS. 2 and 3 are cross-sectional views showing a method for manufacturing a barrier layer of semiconductor device according to the conventional art.
Figure 3:
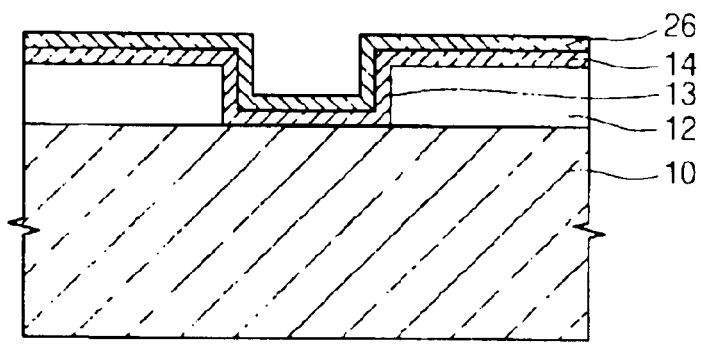

Then, the semiconductor substrate 10 is arranged on the heating unit 120 in the reaction chamber 110, as shown in FIG. 7. Subsequently, a Ti layer 44 is deposited on the lower part and the side of contact hole 13 and on the surface of interlayer insulating layer 12 thicker than the Ti layer 14 in FIG. 1 in accordance with a general sputtering process, collimator sputtering process, IMP process or LTS process in order to improve step coverage. This is because a part of the Ti layer 44 is to be used in the formation of TiN layer 46 by reacting the radical with the Ti of Ti layer 44.

Referring to FIG. 5, a nitrogen gas supplying unit 140 supplies nitrogen gas in the range of 100 sccm to 10000 sccm to a nitrogen radical generating unit 150 through gas supplying line and a microwave generating unit 130 generates microwave in the range of 0.5 GHz to 4 GHz to the nitrogen radical generating unit 150. Therefore, nitrogen gas is exposed to the microwave in the nitrogen radical generating unit 150, thereby generating nitrogen radical. Then, the nitrogen radical is supplied to a nitrogen radical injecting unit 160 of the reaction chamber 110. Here, the nitrogen radical generating unit 150 is arranged within 50 cm from the reaction chamber 110 to use most nitrogen radicals in the formation of TiN layer 46 of FIG. 6 without returning to the original state.

Referring to FIG. 6, the nitrogen radical is injected downwardly from the nitrogen radical injecting unit 160 to the semiconductor substrate 10 through nozzle units 162. Therefore, Ti of the Ti layer 44 reacts with the nitrogen radical to form a TiN layer 46 on the Ti layer 44 in the contact hole 13 and outside thereof, thereby completing the barrier layer. Here, the reaction chamber 110 is maintained at a temperature of normal to 500° C. and a pressure of 10 mTorr to 10 Torr.

Subsequently, a tungsten layer is filled only in the contact hole and then, a metal layer, such as aluminum layer, is formed on the barrier layer outside of the tungsten layer and the contact hole. Finally, a photolithography is performed to complete a metal wiring pattern.

As described above, according to the present invention, it is possible to obtain a high purity TiN layer by forming a contact hole on an interlayer insulating layer of semiconductor substrate, depositing a Ti layer on the interlayer insulating layer in the contact hole and outside thereof and then, performing microwave treatment to nitrogen gas to generate nitrogen radicals and finally reacting these nitrogen radicals with the Ti layer.

Therefore, according to the present invention, it is not required to perform MOCVD process, thereby solving the problems of conventional TiN layer formed by MOCVD process.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a barrier layer in a semiconductor device, comprising the steps of:
   positioning a substrate in a reaction chamber;
   forming an interlayer insulating layer having a contact hole on a semiconductor substrate;
   forming a Ti layer in the contact hole and on the interlayer insulating layer;

supplying nitrogen gas at a flow rate of 100 sccm to 1000 sccm to a nitrogen radical generator located external to the reaction chamber;

treating the nitrogen gas with a high frequency microwave in the range of 0.5 GHz to 4 GHz to generate nitrogen radicals wherein said nitrogen radicals are formed by performing high frequency microwave treatment to the nitrogen gas; and applying the nitrogen radicals to the Ti layer to transform an upper part of the Ti layer into a TiN layer, thereby forming the barrier layer having both Ti and TiN layers, wherein the TiN layer is formed at a temperature of normal to 500° C. and a pressure of 10 mTorr to 10 Torr.

* * * * *